US008241940B2

(12) United States Patent
Moslehi et al.

(10) Patent No.: US 8,241,940 B2
(45) Date of Patent: Aug. 14, 2012

(54) DOUBLE-SIDED REUSABLE TEMPLATE FOR FABRICATION OF SEMICONDUCTOR SUBSTRATES FOR PHOTOVOLTAIC CELL AND MICROELECTRONICS DEVICE MANUFACTURING

(75) Inventors: Mehrdad M. Moslehi, Los Altos, CA (US); Karl-Josef Kramer, San Jose, CA (US); David Xuan-Qi Wang, Fremont, CA (US); Pawan Kapur, Burlingame, CA (US); Somnath Nag, Saratoga, CA (US); George D Kamian, Scotts Valley, CA (US); Jay Ashjaee, Cuptertino, CA (US); Takao Yonehara, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 13/026,239

(22) Filed: Feb. 12, 2011

(65) Prior Publication Data
US 2011/0256654 A1    Oct. 20, 2011

Related U.S. Application Data

(60) Provisional application No. 61/304,340, filed on Feb. 12, 2010.

(51) Int. Cl.
*H01L 21/00* (2006.01)

(52) U.S. Cl. .......... 438/57; 438/8; 438/39; 438/40; 438/43; 438/444; 438/478; 438/494; 438/504; 438/673; 438/689; 438/733; 438/735; 438/745; 257/E31.011; 257/E21.09; 257/E21.221; 257/E21.223; 204/229.5; 136/249; 136/261; 118/720

(58) Field of Classification Search ................. None
See application file for complete search history.

(56) References Cited

U.S. PATENT DOCUMENTS

| 4,043,894 | A | 8/1977 | Gibbs |
| 4,070,206 | A | 1/1978 | Kressel et al. |
| 4,082,570 | A | 4/1978 | House et al. |
| 4,165,252 | A | 8/1979 | Gibbs |
| 4,249,959 | A | 2/1981 | Jebens |
| 4,251,679 | A | 2/1981 | Zwan |
| 4,348,254 | A | 9/1982 | Lindmayer |

(Continued)

FOREIGN PATENT DOCUMENTS

JP    02-154343 A    6/1990

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Charles Garber
*Assistant Examiner* — Yasser Abdelaziez
(74) *Attorney, Agent, or Firm* — Hulsey, P.C.; William N. Hulsey, III; Loren T. Smith

(57) ABSTRACT

This disclosure presents manufacturing methods and apparatus designs for making TFSSs from both sides of a re-usable semiconductor template, thus effectively increasing the substrate manufacturing throughput and reducing the substrate manufacturing cost. This approach also reduces the amortized starting template cost per manufactured substrate (TFSS) by about a factor of 2 for a given number of template reuse cycles.

13 Claims, 10 Drawing Sheets

U.S. PATENT DOCUMENTS

| | | | |
|---|---|---|---|
| 4,361,950 | A | 12/1982 | Amick |
| 4,409,423 | A | 10/1983 | Holt |
| 4,427,839 | A | 1/1984 | Hall |
| 4,430,519 | A | 2/1984 | Young |
| 4,461,922 | A | 7/1984 | Gay et al. |
| 4,479,847 | A | 10/1984 | McCaldin et al. |
| 4,626,613 | A | 12/1986 | Wenham et al. |
| 4,672,023 | A | 6/1987 | Leung |
| 4,922,277 | A | 5/1990 | Carlson et al. |
| 5,024,953 | A | 6/1991 | Uematsu et al. |
| 5,073,230 | A | 12/1991 | Maracas et al. |
| 5,112,453 | A | 5/1992 | Behr et al. |
| 5,208,068 | A | 5/1993 | Davis et al. |
| 5,248,621 | A | 9/1993 | Sano |
| 5,316,593 | A | 5/1994 | Olson et al. |
| 5,348,618 | A | 9/1994 | Canham et al. |
| 5,397,400 | A | 3/1995 | Matsuno et al. |
| 5,458,755 | A | 10/1995 | Fujiyama et al. |
| 5,459,099 | A | 10/1995 | Hsu |
| 5,494,832 | A | 2/1996 | Lehmann et al. |
| 5,538,564 | A | 7/1996 | Kaschmitter |
| 5,616,185 | A | 4/1997 | Kukulka |
| 5,645,684 | A | 7/1997 | Keller |
| 5,660,680 | A | 8/1997 | Keller |
| 5,681,392 | A | 10/1997 | Swain |
| 5,704,992 | A | 1/1998 | Willeke et al. |
| 5,882,988 | A | 3/1999 | Haberern et al. |
| 5,899,360 | A | 5/1999 | Mack et al. |
| 5,928,438 | A | 7/1999 | Salami |
| 5,994,640 | A | 11/1999 | Bansemir et al. |
| 6,058,945 | A | 5/2000 | Fujiyama et al. |
| 6,091,021 | A | 7/2000 | Ruby |
| 6,096,229 | A | 8/2000 | Shahid |
| 6,114,046 | A | 9/2000 | Hanoka |
| 6,127,623 | A | 10/2000 | Nakamura et al. |
| 6,143,629 | A | 11/2000 | Sato |
| 6,204,443 | B1 | 3/2001 | Kiso et al. |
| 6,225,193 | B1 | 5/2001 | Simpson et al. |
| 6,294,725 | B1 | 9/2001 | Hirschberg et al. |
| 6,313,397 | B1 * | 11/2001 | Washio et al. ............ 136/256 |
| 6,331,208 | B1 | 12/2001 | Nishida et al. |
| 6,399,143 | B1 | 6/2002 | Sun et al. |
| 6,416,647 | B1 | 7/2002 | Dordi et al. |
| 6,428,620 | B1 | 8/2002 | Yamagata et al. |
| 6,429,037 | B1 | 8/2002 | Wenham et al. |
| 6,441,297 | B1 | 8/2002 | Keller et al. |
| 6,448,155 | B1 | 9/2002 | Iwasaki et al. |
| 6,461,932 | B1 | 10/2002 | Wang |
| 6,524,880 | B2 | 2/2003 | Moon et al. |
| 6,534,336 | B1 | 3/2003 | Iwane |
| 6,551,908 | B2 | 4/2003 | Ukiyo et al. |
| 6,555,443 | B1 | 4/2003 | Artmann et al. |
| 6,566,235 | B2 | 5/2003 | Nishida et al. |
| 6,602,760 | B2 | 8/2003 | Poortmans et al. |
| 6,602,767 | B2 | 8/2003 | Nishida et al. |
| 6,613,148 | B1 | 9/2003 | Rasmussen |
| 6,624,009 | B1 | 9/2003 | Green et al. |
| 6,645,833 | B2 | 11/2003 | Brendel |
| 6,649,485 | B2 | 11/2003 | Solanki et al. |
| 6,653,722 | B2 | 11/2003 | Blalock |
| 6,664,169 | B1 * | 12/2003 | Iwasaki et al. ............ 438/409 |
| 6,756,289 | B1 | 6/2004 | Nakagawa et al. |
| 6,805,966 | B1 | 10/2004 | Formato et al. |
| 6,818,104 | B2 | 11/2004 | Iwasaki et al. |
| 6,881,644 | B2 | 4/2005 | Malik et al. |
| 6,946,052 | B2 | 9/2005 | Yanagita et al. |
| 6,964,732 | B2 | 11/2005 | Solanki |
| 7,014,748 | B2 | 3/2006 | Matsumura et al. |
| 7,022,585 | B2 | 4/2006 | Solanki et al. |
| 7,026,237 | B2 | 4/2006 | Lamb |
| 7,309,658 | B2 | 12/2007 | Lazovsky et al. |
| 7,368,756 | B2 | 5/2008 | Bruhns et al. |
| 7,402,523 | B2 | 7/2008 | Nishimura |
| 2002/0079290 | A1 | 6/2002 | Holdermann |
| 2002/0153039 | A1 | 10/2002 | Moon et al. |
| 2002/0168592 | A1 | 11/2002 | Vezenov |
| 2002/0179140 | A1 | 12/2002 | Toyomura |
| 2003/0017712 | A1 | 1/2003 | Brendel |
| 2003/0039843 | A1 | 2/2003 | Johnson |
| 2003/0124761 | A1 | 7/2003 | Baert |
| 2004/0028875 | A1 | 2/2004 | Van Rijn |
| 2004/0173790 | A1 | 9/2004 | Yeo et al. |
| 2004/0175893 | A1 | 9/2004 | Vatus et al. |
| 2004/0192044 | A1 | 9/2004 | Degertekin et al. |
| 2004/0235406 | A1 | 11/2004 | Duescher |
| 2004/0259335 | A1 | 12/2004 | Narayanan |
| 2004/0265587 | A1 | 12/2004 | Koyanagi |
| 2005/0160970 | A1 | 7/2005 | Niira |
| 2005/0172998 | A1 | 8/2005 | Gee et al. |
| 2005/0176164 | A1 | 8/2005 | Gee et al. |
| 2005/0177343 | A1 | 8/2005 | Nagae |
| 2005/0199279 | A1 | 9/2005 | Yoshimine et al. |
| 2005/0274410 | A1 | 12/2005 | Yuuki et al. |
| 2005/0281982 | A1 | 12/2005 | Li |
| 2006/0021565 | A1 | 2/2006 | Zahler et al. |
| 2006/0043495 | A1 | 3/2006 | Uno |
| 2006/0054212 | A1 | 3/2006 | Fraas et al. |
| 2006/0070884 | A1 | 4/2006 | Momoi et al. |
| 2006/0105492 | A1 | 5/2006 | Veres et al. |
| 2006/0177988 | A1 | 8/2006 | Shea et al. |
| 2006/0196536 | A1 | 9/2006 | Fujioka |
| 2006/0231031 | A1 | 10/2006 | Dings et al. |
| 2006/0266916 | A1 | 11/2006 | Miller et al. |
| 2006/0283495 | A1 | 12/2006 | Gibson |
| 2006/0286775 | A1 | 12/2006 | Singh et al. |
| 2007/0077770 | A1 | 4/2007 | Wang et al. |
| 2007/0082499 | A1 | 4/2007 | Jung et al. |
| 2008/0047601 | A1 | 2/2008 | Nag et al. |
| 2008/0128641 | A1 | 6/2008 | Henley et al. |
| 2008/0157283 | A1 | 7/2008 | Moslehi |
| 2008/0210294 | A1 | 9/2008 | Moslehi |
| 2008/0264477 | A1 | 10/2008 | Moslehi |
| 2008/0289684 | A1 | 11/2008 | Moslehi |
| 2008/0295887 | A1 | 12/2008 | Moslehi |
| 2009/0042320 | A1 | 2/2009 | Wang et al. |
| 2009/0107545 | A1 | 4/2009 | Moslehi |
| 2009/0301549 | A1 | 12/2009 | Moslehi |
| 2010/0022074 | A1 | 1/2010 | Wang et al. |
| 2010/0116316 | A1 | 5/2010 | Moslehi et al. |
| 2010/0144080 | A1 | 6/2010 | Ong |
| 2010/0148318 | A1 | 6/2010 | Wang et al. |
| 2010/0148319 | A1 | 6/2010 | Wang et al. |
| 2010/0154998 | A1 | 6/2010 | Ong |
| 2010/0175752 | A1 | 7/2010 | Wang et al. |
| 2010/0203711 | A1 | 8/2010 | Wang et al. |
| 2010/0267186 | A1 | 10/2010 | Wang et al. |
| 2010/0267245 | A1 | 10/2010 | Kamian et al. |
| 2010/0279494 | A1 | 11/2010 | Wang et al. |
| 2010/0294333 | A1 | 11/2010 | Wang et al. |
| 2010/0294356 | A1 | 11/2010 | Parikh et al. |
| 2010/0300518 | A1 | 12/2010 | Moslehi et al. |
| 2010/0304521 | A1 | 12/2010 | Seutter et al. |
| 2010/0304522 | A1 | 12/2010 | Rana et al. |
| 2011/0014742 | A1 | 1/2011 | Parikh et al. |
| 2011/0030610 | A1 | 2/2011 | Kamian et al. |

FOREIGN PATENT DOCUMENTS

| | | |
|---|---|---|
| JP | 06-260670 A | 9/1994 |
| JP | 2002-2299661 A | 10/2002 |
| JP | 2007-224375 A | 9/2007 |
| WO | PCT/EP1999/008573 | 5/2000 |

OTHER PUBLICATIONS

C. Berge, 150-mm Layer Transfer for Monocrystalline Silicon Solar Cells, Solar Energy Materials & Solar Cells, 2006, pp. 3102-3107, vol. 90, Elsevier B.V.

C. Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S. Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S. Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F. Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J. Kim, et al, Large-Area Thin-Film Free-Standing Monocrystalline Si Solar cells by Layer Transfer, Leuven, Belgium, IEEE.

J.H. Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd..

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J. Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R. Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

DOUBLE-SIDED REUSABLE TEMPLATE FOR FABRICATION OF SEMICONDUCTOR SUBSTRATES FOR PHOTOVOLTAIC CELL AND MICROELECTRONICS DEVICE MANUFACTURING

CROSS-REFERENCE TO RELATED APPLICATIONS

This application claims priority to U.S. Provisional Patent Application Ser. No. 61/304,340, filed Feb. 12, 2010, which is hereby incorporated by reference in its entirety. Other related applications having common inventorship and/or ownership are mentioned throughout this disclosure, and they are also incorporated by reference in their entirety.

FIELD

This disclosure relates in general to the field of photovoltaics and microelectronics, and more particularly to fabrication processes and manufacturing equipment for thin-film (or thin foil) crystalline (monocrystalline, multicrystalline, and polycrystalline) semiconductor substrates, in some embodiments with the film or foil thickness ranging between about 1 micron up to about 100 microns. This disclosure provides for such manufacturing at low costs and high throughputs.

BACKGROUND

Currently, crystalline silicon has the largest market share in the photovoltaics (PV) industry, accounting for over 80% of the overall PV market share. Although going to thinner crystalline silicon solar cells is long understood to be one of the most potent ways to reduce PV cost (because of the relatively high material cost of crystalline silicon wafers used in solar cells as a fraction of the total PV module cost), it is fraught with the problem of mechanical breakage due to the thin and large substrate sizes, and also to some extent that of light trapping in a thin structure (since silicon is an indirect bandgap semiconductor material). The requirement of high mechanical yield and reduced wafer breakage rate is further problematic with the realization that for cost-effectiveness, the yields in PV manufacturing factories must be very high. On a standalone crystalline silicon solar cell (without support), going even somewhat below the current thickness range of 140-250 microns starts to severely compromise mechanical yield during manufacturing. Thus, any solution to process very thin solar cell structures must either be fully supported by a host carrier throughout the cell process or use a novel self-supporting, standalone, substrate with an accompanying structural innovation.

Innovative manufacturing processes to produce solar cells at low costs using thin-film semiconductor substrates (TFSSs) as the active material have been disclosed in related applications. In some embodiments, the TFSSs comprise crystalline semiconductor (more specifically silicon in some embodiments). This technology platform produces solar cells from re-usable semiconductor templates. In certain embodiment, the surfaces of the templates have a periodic array of pre-structured 3-dimensional (3-D) structures. Examples of the 3-D TFSS based solar cells include but are not limited to prism honey-comb and inverted pyramidal cavities, which are described in earlier applications having common inventorship and/or ownership. The following are examples of related applications.

U.S. Patent Publications US2008/0157283 A1, US2008/0289684 A1, US2010/0148318 A1, US2010/0300518; U.S. patent application Ser. No. 13/057,104; PCT Application Serial Nos. PCT/US10/60591, PCT/US10/62614.

As disclosed by the above documents, the epitaxial substrate is grown on top of a reusable template and is subsequently dislodged. In one embodiment, the template and substrate each comprise monocrystalline silicon. Afterwards, the reusable template may be reused several times, with or without reconditioning, to grow more epitaxial substrates. The reusable template has a planar top surface or a top surface with pre-formed 3-D microstructures, such as hexagonal honey-comb cavities or inverted pyramidal cavities. The releasing of the 3-D TFSS is achieved with an interim sacrificial layer. The sacrificial layer should satisfy two important criteria. First, it needs to transfer the information on crystallinity from the reusable template to the epitaxial layer. Second, it should be able to be removed selectively compared to the substrate and the reusable template. One specific embodiment of the sacrificial layer is porous silicon, whose porosity can be modulated to achieve both the aforementioned critical functions.

As disclosed by the above documents, the planar or 3-D TFSSs are made and released from one-side, i.e., the top surface of a reusable template. In other words, one solar substrate is made from a reusable template in each of its reuse cycles. In those disclosures, the template and substrate making equipment, and the porous silicon forming and epitaxial silicon growing equipment is capable of processing on only one side of the silicon template. The equipment is capable of processing multiple wafers at a time in a batching processing mode, but only one side of each template is used.

Solar cell manufacturing requires much higher productivity with much lower costs compared with semiconductor processes. Therefore, there it may be advantageous to develop manufacturing processes and equipment capable of making thin semiconductor substrates from both sides of a reusable template simultaneously.

SUMMARY

In order to reduce the thin-film crystalline semiconductor (such as silicon) substrate manufacturing costs and increase the production throughputs, this disclosure provides manufacturing methods and apparatus designs for making TFSSs (or thin semiconductor such as silicon foils) from both sides of a re-usable semiconductor template, thus effectively increasing the substrate manufacturing throughput and reducing the substrate manufacturing cost. This approach also reduces the amortized starting template cost per manufactured substrate (TFSS) by about a factor of 2 for a given number of template reuse cycles.

In accordance with the present disclosure, a double-sided semiconductor (such as silicon) wafer with either planar surfaces or pre-structured 3-D structures is prepared for use as a re-usable template (or a reusable micromold). The planar templates may be surface polished or surface textured with random or regular arrayed surface roughness. The 3-D templates have 3-D structures, such as honey-comb prisms or inverted pyramidal cavities made on both sides of the templates. The surface structures on the front and back sides of a template may or may not be same in terms of surface structures. For example, the back side structures may be misaligned compared to the front side structures to ensure increased template mechanical strength. In another example, the front side of a template may consist of 3-D structures, while the back side may be planar; however both sides may actively be used for making TFSSs. In yet another example, both sides of the template may be planar to manufacture TFSS (or thin silicon foil) without any pre-structured 3D patterns.

In accordance with the present disclosure, suitable thin sacrificial layers, such as porous silicon layers, are formed on both sides of the templates for substrate release. These may be formed using a single batch processing tool (although the sacrificial layers may be formed on both sides sequentially using two separate sequential steps in one or two porous silicon formation processing tools). The porous silicon layers are used as seed layers for epitaxial silicon growth and also used as a mechanically weak layer to facilitate the spatially selective release of the epitaxial silicon layers (i.e., the TFSS) from the template (both frontside and backside, thus effectively doubling the throughput).

In accordance with the present disclosure, thin epitaxial silicon layers are grown concurrently on both sides of the templates in a single load of epitaxial process using chemical-vapor deposition (CVD).

In accordance with the present disclosure, TFSSs made from epitaxial silicon layers are released from both sides of the template after exposing the buried porous silicon layer from the template edges. The released TFSS films or foils (or wafers) from both sides may or may not be the same in terms of their physical structures. However, regardless of their shapes and sizes, TFSS parts released from front and back sides of a template may both be used to make solar cells (or microelectronic devices).

In accordance with the present disclosure, after releasing the TFSS from each side of a template, the template may be reconditioned and cleaned as needed followed by its next reuse cycle. Each template in this disclosure may be used multiple cycles until it becomes too thin to handle or until it loses its structural properties. In those cases, the used templates may be recycled.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein.

DETAILED DESCRIPTION

Although the present disclosure is described with reference to specific embodiments, one skilled in the art could apply the principles discussed herein to other areas and/or embodiments without undue experimentation.

Figure 1A:
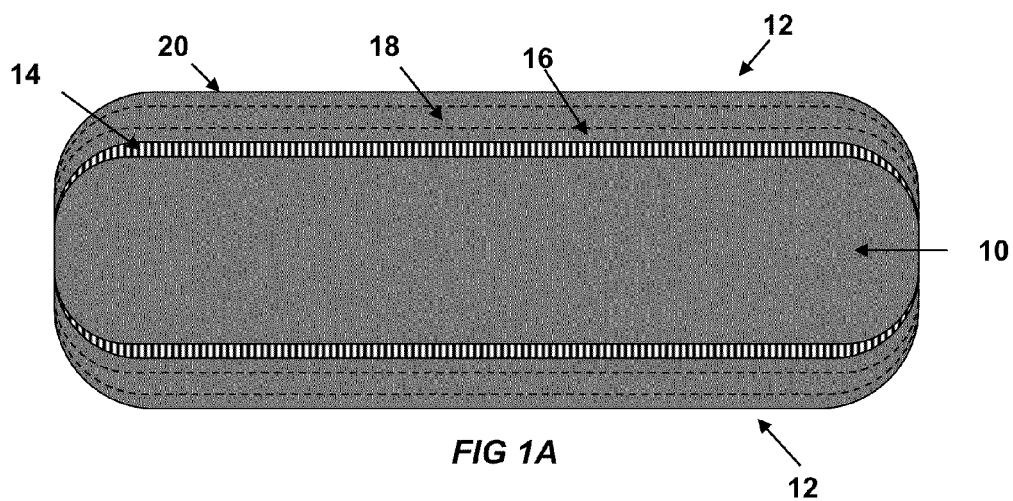
FIGS. 1A and 1B illustrate cross-sectional schematic drawings of a double-sided planar template before and after its TFSS releasing, respectively.
Figure 1B:
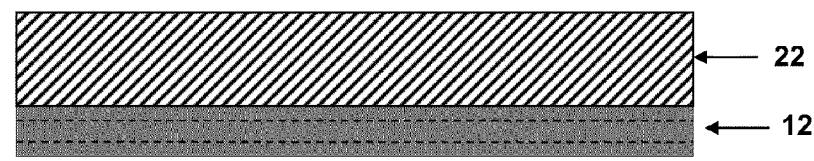
Figure 1B:
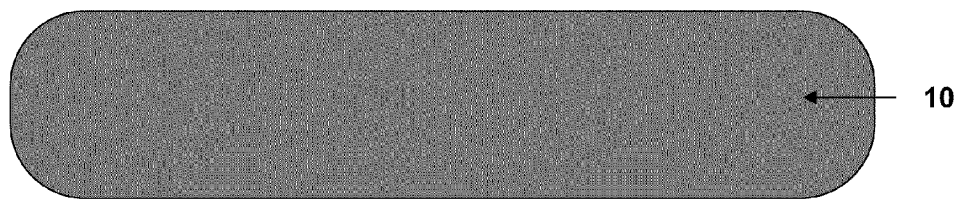
Figure 1B:
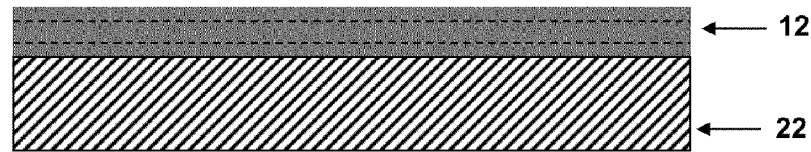

FIG. 1A and FIG. 1B illustrate cross-sectional schematic drawings of double-sided planar template 10 before and after TFSSs 12 are released from both sides. As illustrated in FIG. 1A, epitaxially grown silicon layers are formed, in some embodiments concurrently, by an epitaxial silicon growth process, on both sides of a planar template and on top of porous silicon layers 14 on the template frontside and backside surfaces. The template may be made of a monocrystalline silicon wafer with polished surfaces surface (although wafers with non-polished surfaces and/or polycrystalline or multicrystalline silicon wafers may also be used as templates). The wafer diameter may be in the range of approximately 150 to 450 mm and the wafer thickness may be in the range of approximately 0.5 to 1 mm. Even thicker wafers may be used, up to several millimeters in thickness. The template may be in a circular shape, a square/rectangular shape, or a pseudo-square/pseudo-rectangular shape with rounded corners. The porous silicon layer may consist of a single layer, a bilayer or multilayer having different porosities, or a graded porosity layer. For example, the porous silicon sub-layer that contacts the template may have a higher porosity than the sub-layer that contacts the epitaxial layer. The overall epitaxial layer thickness may be in the range of approximately 1 to 100 microns and it may consist of layers of different types and levels of doping. For example for solar cell applications, thin layer 16 that makes contact to the buried porous silicon layer may be $n^+$ (phosphorous) doped to form the front-surface-field (FSF) of the solar cell; middle layer 18 may be n (phosphorous) doped to form the base region of the solar cell; and outer epitaxial layer 20 may be $p^+$ (boron) doped to form the emitter region of the solar cell (or alternatively with opposite doping polarities for solar cells with p-type base).

The epitaxial layer on the wafer edge may be removed (as shown in FIG. 1B) to expose the buried porous silicon layer so that the epitaxial layers may be released from the template. Alternatively, the epitaxial layers may be prevented from growing at the template edges by mechanical shadowing and/or a hydrogen gas flow depletion purge. In another alternative method, the TFSS edges are defined by laser trench cutting with the cutting depth no larger than approximately the epitaxial layer thickness. In this method, the remaining epitaxial silicon layers at template edges may be removed after the TFSS is released by template edge lapping, grinding or polishing. As illustrated in FIG. 1B, the epitaxial layers are released from the template to form TFSSs with optional reinforcement/support plates 22. The thin silicon reinforcement or support plates may be temporarily or permanently mounted on the TFSSs to enhance their handle-ability during subsequence solar cell processing steps. As disclosed in related applications, the reinforcement plates may be made from solar grade glass, polymers, or other materials. There also may be solar grade adhesive layers used for making permanent bond between the reinforcement plate and TFSS. In the case that the epitaxial layer is thicker than about 50 microns and the TFSS size is smaller than about 150 mm in diameter, the reinforcement plates may not be needed. After the TFSS releasing, the template may be cleaned, reconditioned (in this sequence or in the reverse sequence of reconditioning followed by cleaning) and then reused. The TFSSs then go through the subsequent solar cell making process, including but not limited to surface cleaning, doping, passivation and contact making steps as disclosed in related applications.

Figures 2A, 2B:
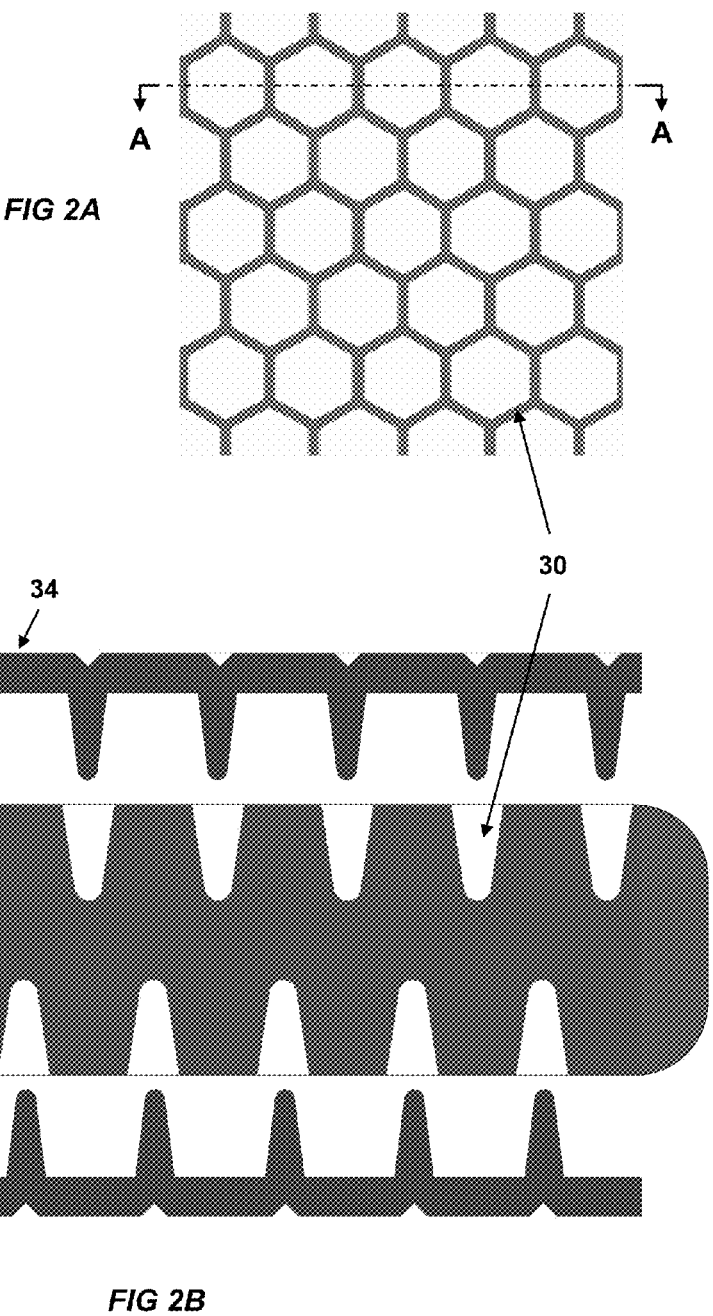
FIG. 2A illustrates a front view of a double-sided reusable template with hexagonal honeycomb interconnected trenches.
FIG. 2B illustrates a cross-sectional schematic drawing of a double-sided template with prism honey-comb 3-D structures and TFSSs released from both sides of the template.

FIGS. 2A and 2B illustrate a double-sided template with hexagonal honeycomb 3-D structures and TFSSs made from both sides of the reusable template. FIG. 2A illustrates a partial front-view schematic drawing of the template. The template may be made of a monocrystalline silicon wafer, although polycrystalline or multicrystalline wafers may also be used as templates. The template has pre-structured front and back side surfaces. More specifically, sidewall tapered hexagonal honeycomb trenches 30 are made in the silicon template on both of its sides. FIG. 2B illustrates a cross-sectional schematic drawing (along the A-A cut direction) of the template after the release of TFSSs 34 (the drawing dimensions are not shown to scale). As shown, trench sidewalls 32 are tapered and the taper angle may be from several degrees to tens of degrees (in some embodiments approximately 3 to 10 degrees). The trench height may be approximately 50 to 300 microns, or more specifically in some embodiments 75 to 150 microns. The top trench width may be approximately 10 to 100 microns, or more specifically in some embodiments 20 to 50 microns. The backside structures may be misaligned to the front side structures to ensure increased template mechanical strength. The template wafer diameter is in the range of approximately 150 to 450 mm, and the wafer thickness is approximately in the range of 0.5 to over 1 mm (even thicker wafers may be used, up to several mm in thickness). Porous silicon layers (not shown) are initially formed on both sides of the template surfaces, as discussed in the planar TFSS case. Then epitaxially grown silicon layers are formed on both sides of the template on top of the porous silicon layers. The epitaxial layer thickness is in the range of about 1 to 100 microns and it may consist of various doping types and levels across its depth, as explained in the planar TFSS case. For simplicity of schematic drawing purpose, the doping types and levels are not shown in FIG. 2B. In order to release the epitaxial layers from the template, the epitaxial layer on the wafer edge is removed to expose the buried porous silicon layer.

Alternatively, the epitaxial growth is prevented from growing at template edges by mechanical shadowing. In another alternative method, the TFSS edges are defined by laser trench cutting with the cutting depth is no larger than approximately the epitaxial layer thickness. In this method, the remaining epitaxial silicon layers at template edges may be removed after TFSS release by template edge lapping, grinding or polishing. As illustrated in FIG. 2B, the epitaxial layers are released from the template to form free-standing TFSSs without the needs of reinforcement plates. After TFSS release, the template may be cleaned, reconditioned and then reused. The TFSSs then go through the subsequent solar cell making process, including but not limited to surface cleaning, doping, passivation and contact making steps as disclosed in related applications.

Figures 3A, 3B:
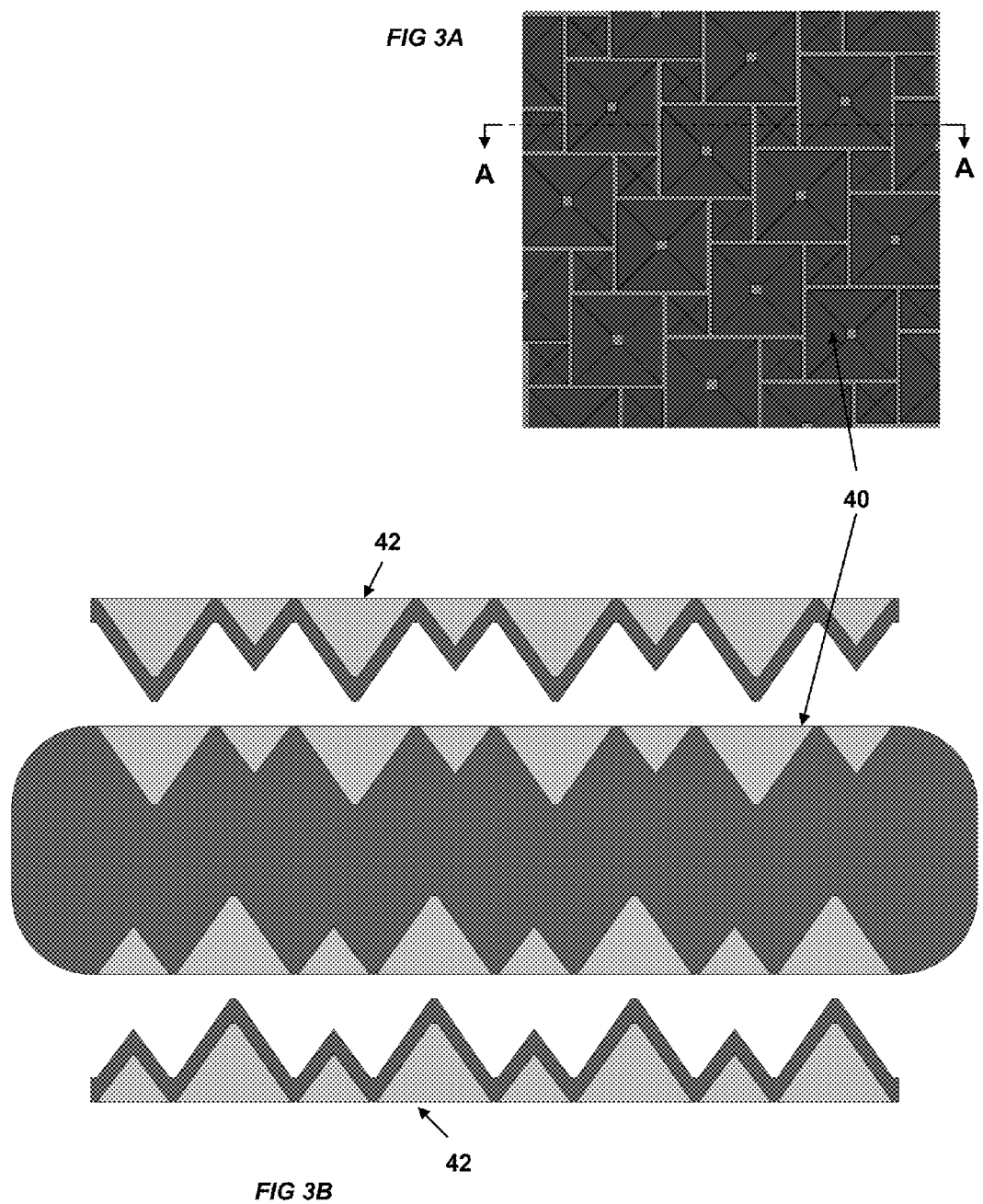
FIG. 3A illustrates a front-view schematic drawing of a double-sided reusable template with inverted pyramidal cavities.
FIG. 3B illustrates a schematic drawings of a double-sided template with inverted pyramid 3-D structures and TFSSs released from both sides of the template.

FIGS. 3A and 3B illustrate a double-sided template with inverted pyramid 3-D structures and TFSSs made from both sides of the reusable template. FIG. 3A illustrates a partial front-view schematic drawing of the template. The template may be made of a monocrystalline silicon wafer, although polycrystalline or multicrystalline wafers may also be used as templates. The template has pre-structured front and back side surfaces. More specifically, inverted pyramidal cavities 40 are made into the silicon template on both of its sides. To facilitate formation of the pyramidal pattern, the template may be a (100) monocrystalline silicon wafer. The inverted pyramidal cavities are aligned to the (100) directions and have their sidewalls etched to (111) crystallographic planes of mono-crystalline silicon. The sidewalls have 54.7° angles against the top lateral plane. The cavity top openings are in the range of approximately 50 to 500 microns and depths are in the range of approximately 50 to 250 microns. FIG. 3B illustrates a cross-sectional schematic drawing (along the A-A cut direction) of the template after the release of TFSSs 42 (the drawing dimensions are not shown to scale). The back side structures may be misaligned to the front side structures to ensure increased template mechanical strength. The template wafer diameter may be in the range of approximately 150 to 450 mm, and the wafer thickness may be approximately in the range of 0.5 to 1 mm (or even a few mm). As described above, a porous silicon layer or layers may be formed on both sides of the template. Then epitaxially grown silicon layers are formed on both sides of the template on top of the porous silicon layers. The epitaxial layer thickness is in the range of about 1 to 100 microns and it may consist of various doping types and levels across its depth, as explained in the planar TFSS case. For simplicity of schematic drawing purpose, the doping types and levels are not shown in FIG. 3B. In order to release the epitaxial layers from the template, the epitaxial layer on the wafer edge is removed to expose the buried porous silicon layer.

Alternatively, the epitaxial layer is prevented from growing at template edges by mechanical shadowing. In another alternative method, the TFSS edges are defined by laser trench cutting with the cutting depth no larger than approximately the epitaxial layer thickness. In this method, the remaining epitaxial silicon layers at template edges may be removed after the TFSS releasing by template edge lapping, grinding or polishing.

As illustrated in FIG. 3B, the epitaxial layers are released from the template to form free-standing TFSSs without the need for reinforcement plates. After the TFSS releasing, the template may be cleaned, reconditioned and then reused. The TFSSs then go through the subsequent solar cell making process, including but not limited to surface cleaning, doping, passivation and contact making steps as disclosed in related applications.

Figure 4:
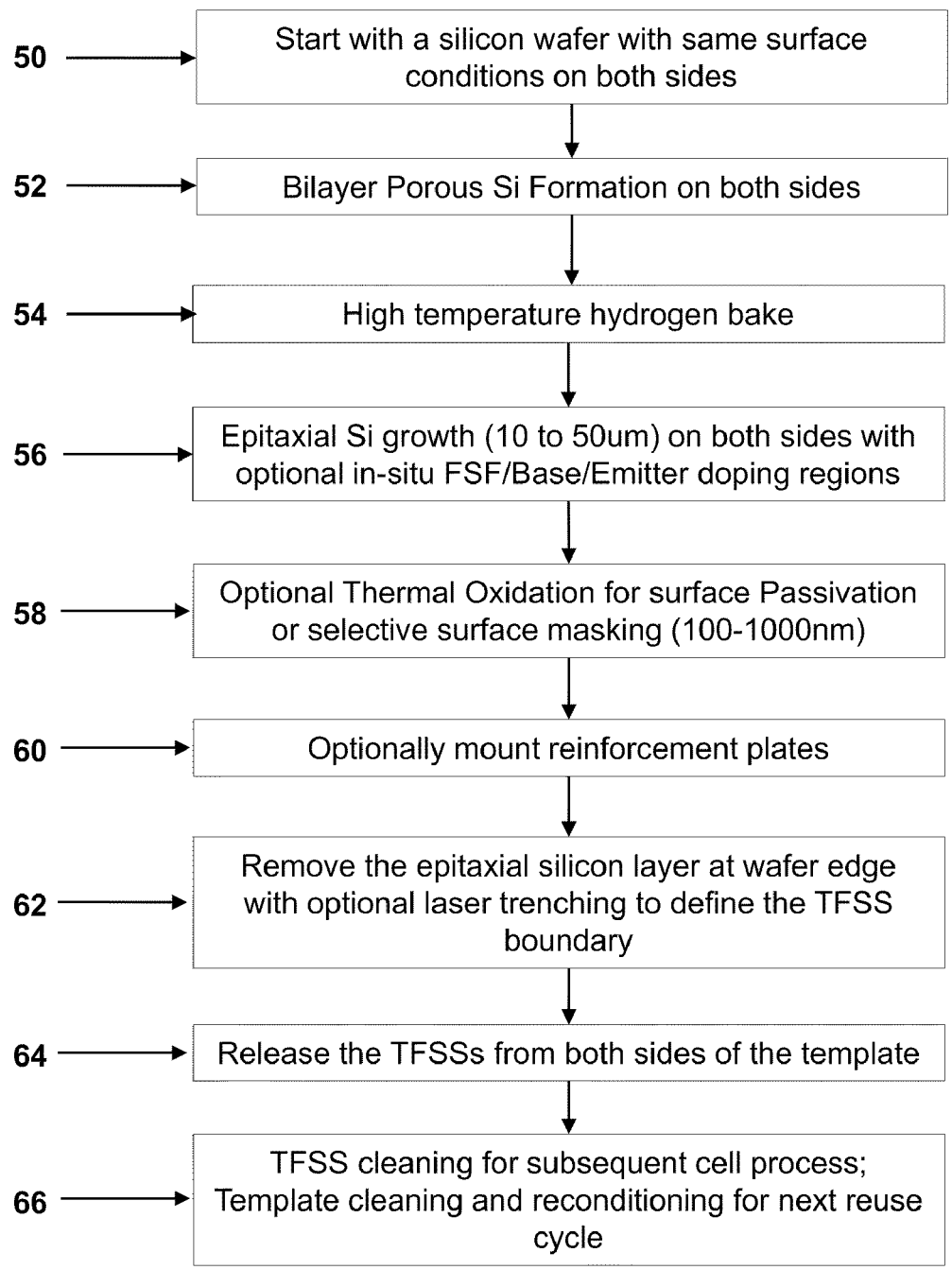
FIG. 4 illustrates a block diagram of making planar TFSSs using the double-sided re-usable template.

FIG. 4 outlines the major process steps in one embodiment of a process flow for making planar TFSSs using the double-sided re-usable template approach of this disclosure. The fabrication process starts at step 50 from a substantially planar template, which may be a monocrystalline (100) silicon wafer. The starting wafer could be in circular or square or rectangular or polygonal shapes. Both sides of the template surface may be the same in term of their surface finishes, or they may be different. In one embodiment, the front and back surfaces are non-textured and polished. In another embodiment, shallow (e.g. less than about 10 microns) and random textures are formed on both sides of the template surfaces. The (100) silicon wafer surface texturing processes are known in the prior arts and are usually conducted by diluted alkaline chemistry, such as KOH or NaOH silicon etching.

At step 52, a porous silicon layer is formed by electro-chemical anodic HF etching of silicon on both the front and back sides of the template surfaces. During the porous silicon forming in an HF/IPA (or HF/acetic acid) solution, the electrical current polarity is periodically switched between positive and negative currents so that each template side is successively etched in order to form the bilayer or multi-layer porous silicon structure on both template sides. In addition to the periodical current polarity switching, the current intensity is also changed in a controlled manner to form a porous silicon bilayer or multilayer that consists of the desired different (low and high) porosities. The first thin porous silicon layer is on the top and is first formed from the bulk silicon wafer. The first thin layer has a lower porosity of approximately 15% to 30%. The second thin porous silicon layer is directly grown from the bulk silicon and is underneath the first thin layer of porous silicon. The second thin porous silicon layer may have a higher porosity in the range of approximately 40%-80%. The top lower porosity layer is used as a crystalline seed layer for high quality epitaxial silicon growth, and the underneath higher porosity porous silicon layer is used for facilitating TFSS releasing due to its low-density physical connections (between the epitaxial and bulk silicon interfaces) and its weak mechanical strength.

Alternatively, a single porosity release layer with a progressively increased porosity from top to bottom can also be used. In this case, the top portion of the porous silicon layer has a low porosity of approximately 15% to 30%, and the lower portion of the porous silicon layer has a high porosity of approximately 40% to 80%, with a region of graded porosity in between.

At step 54, and before the epitaxial silicon growth, the wafer is baked in a high temperature (at approximately 950° C. to 1200° C., and more specifically in some embodiments in the range of 1050° C. to 1150° C.) hydrogen environment within the epitaxial silicon deposition reactor in order to form coalesced structures (with relatively large voids) within the higher-porosity buried porous silicon layer while forming a continuous surface seed layer of crystalline silicon on the top of the lower-porosity porous silicon layer.

Next, at step 56, a mono-crystalline epitaxial silicon layer is concurrently deposited on both sides of the template, preferably in a high-throughput large-batch epitaxial furnace. The epitaxial layer may be in-situ doped. For example for solar cell applications, the bulk base of the epitaxial layer may be n (phosphorous) doped, the inner layer may be n$^+$ (phosphorous) doped to form the FSF, and the outer layer may be p (boron) doped to form the emitter region of the solar cell. The thickness of the epitaxial layer is in the range of 1 to 100 microns.

In optional step 58, a thin oxide layer is thermally grown on the epitaxial surface. The thin oxide layer may be used for solar cell surface passivation or a masking layer for subsequent selective surface openings.

In optional step 60, temporary or permanent reinforcement plates are mounted on the front and back silicon surfaces. The reinforcement plates also serve as carriers for enabling handling and processing thin TFSSs using commercially available solar cell manufacturing equipment, as disclosed in PCT application serial nos. PCT/US10/60591 and PCT/US10/62614.

Next, at step 62, the epitaxial layer on the wafer edge is removed by template edge lapping, grinding or polishing, to expose the buried porous silicon layer so that the epitaxial layers may be released from the template. Alternatively, the epitaxial growth is prevented from growing at template edges by mechanical shadowing. In another alternative method, as disclosed in related applications, the TFSS edges are defined by laser trench cutting the cutting depth no larger than approximately the epitaxial layer thickness.

In step 64, the optionally reinforced epitaxial layer of silicon is released/separated from the template, and the released epitaxial silicon layer is therefore referred as a thin film silicon substrate. Related applications disclose detailed methods of releasing the epitaxial layer to form a TFSS. In one of the disclosed methods, the TFSS is released in an ultrasonic DI-water bath. In another disclosed method, the TFSS is released by direct pulling with the wafer backside and the top epitaxial layer vacuum chucked.

In step 66, the released TFSS backside surface is cleaned by short silicon etching using KOH or TMAH solutions to remove the silicon debris and fully or partially remove the quasi-monocrystalline silicon (QMS) layer. In the meantime and after removal of the edge epitaxial silicon layer from the template, the template is cleaned by using diluted HF and diluted wet silicon etch solution, such as TMAH and/or KOH to remove the remaining porous silicon layers and silicon particles. Then the template is further cleaned by conventional silicon wafer cleaning methods, such as SC1 and SC2 wet cleaning (or the so-called RCA cleaning process) to removal possible organic and metallic contaminations. Finally, after proper rinsing with DI water and N$_2$ drying, the template is ready for another re-use cycle.

Figure 5A:
FIGS. 5A-5E illustrate cross-sectional schematic drawings of the planar TFSS making process, after major process steps, using the double-sided re-usable template.

FIGS. 5A-5E illustrate cross-sectional schematic drawings of the planar TFSS making process, after major processing steps, using the double-sided re-usable template. The dimensions in these drawings are not drawn to scale. FIG. 5A illustrates starting template 70 that has substantially planar front and back surfaces.

Figure 5B:
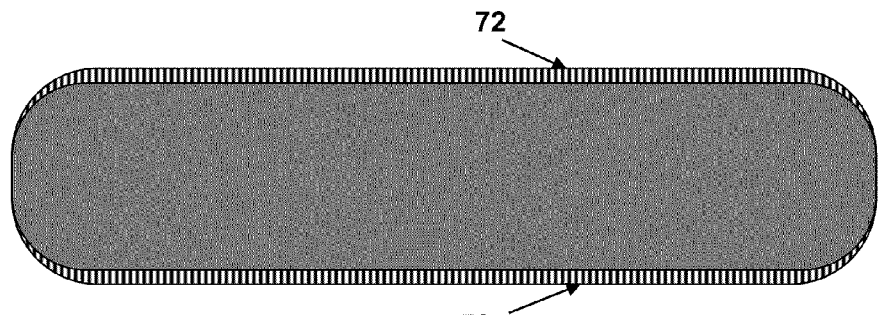

FIG. 5B illustrates the template after formation of porous silicon 72 on both its front and back surfaces. However, the porous silicon layers on the front and back surfaces are not connected, since there is no porous silicon formed on the very edge or bevel area of the template.

Figure 5C:
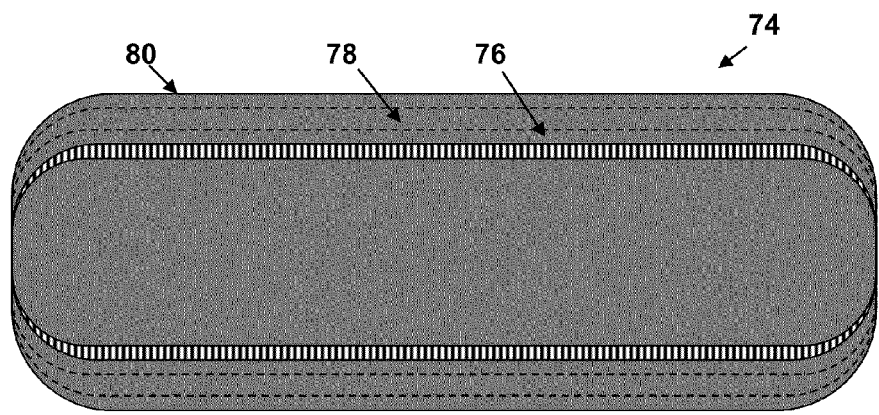

FIG. 5C illustrates the grown epitaxial layers 74 on both the front and back template surfaces. Epitaxial layers 74 in this example comprise n$^+$ doped FSF layer 76, n doped base 78, and p$^+$ doped emitter 80. Depending on the template holding configuration in the epitaxial growth chamber, there may or may not be thin epitaxial silicon layers grown on the very edge or bevel area of the template surface.

Figure 5D:
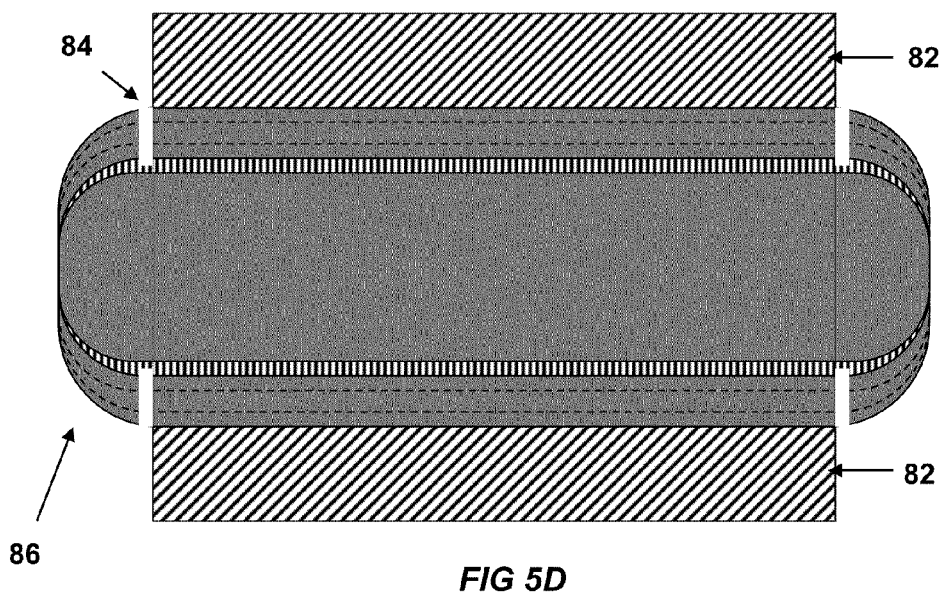

FIG. 5D illustrates the step after reinforcement plates 82 are mounted and border definition trenches 84 are made at the edges of the TFSS. Edge epitaxial layers 86 may be removed before or after TFSS separation.

Figure 5E:
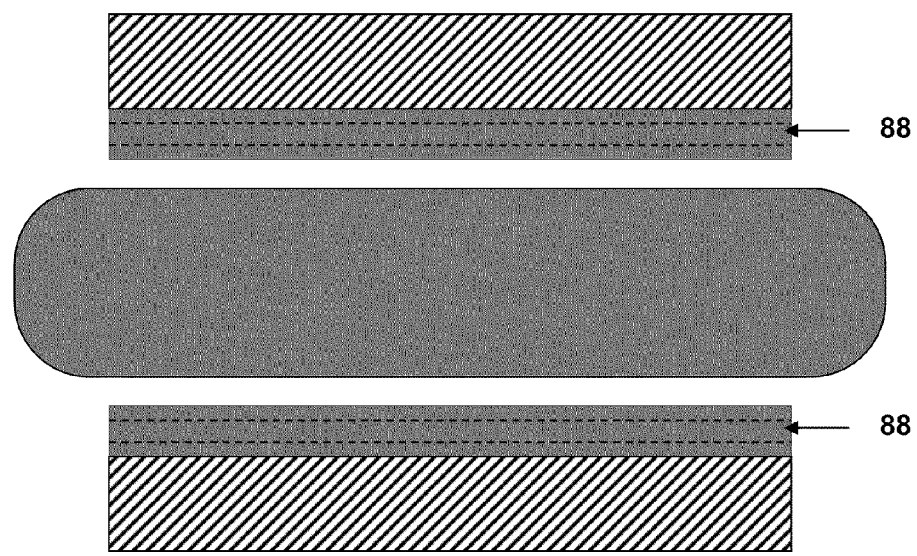

FIG. 5E illustrates the release of TFSSs 88 with the reinforcement plates. The separation of TFSSs 88 from the template surface happens in the buried porous silicon layers. The remaining porous silicon layers and/or QMS thin layers on the TFSS and template surfaces are etched off by wet chemical etching, such as diluted KOH or NaOH solution (or alternatively using an HF-nitric-acetic (HNA) solution), after the TFSS release. The remaining epitaxial and QMS silicon layers on the template edges are also removed or etched off prior to the next template reuse cycle.

Figure 6:
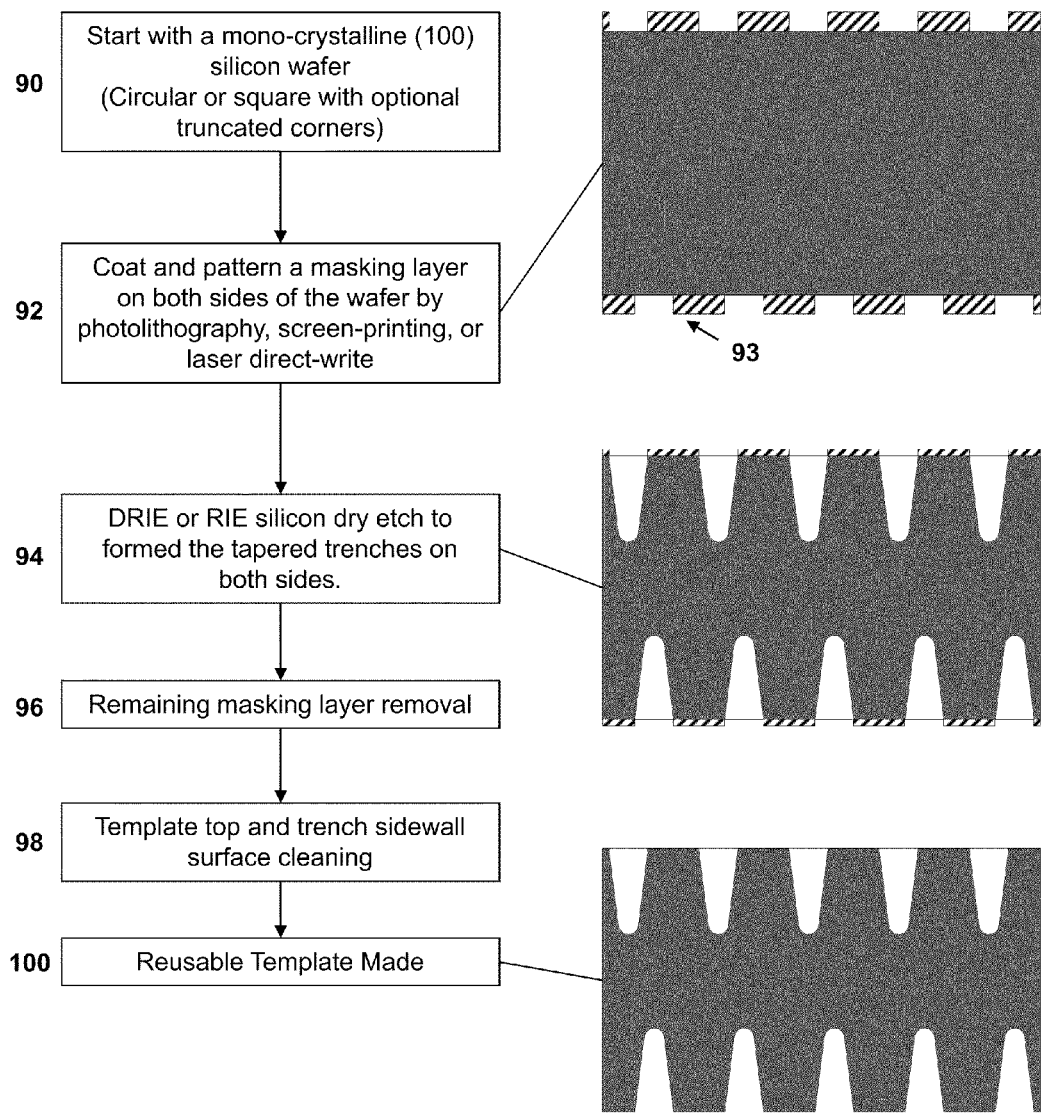
FIG. 6 illustrates major fabrication process steps for making double-sided re-usable template that have hexagonal honeycomb trenches.

FIG. 6 shows a process flow and illustrates the template after major fabrication process steps for making double-sided re-usable templates that have hexagonal honeycomb trenches. Such 3-D templates are used to make honeycomb TFSSs.

The template fabrication process starts at step 90 with a mono-crystalline (100) silicon wafer. In step 92, photoresist layers 93 are coated and patterned on both the front and back side surfaces of the template. Alternatively, resist layers could be screen printed.

Next, at step 94, the front and back side silicon trenches are etched in a deep-reactive-ion-etch (DRIE) or a reactive-ionetch (RIE) process using silicon etching gases, such as $SF_6$. In the DRIE process, periodic surface passivation using $C_4F_8$ gas is performed to control the trench sidewall surfaces. The trench etching is time-controlled. After the trench etching, the remaining resist layer is removed at step 96, and all the exposed silicon surfaces are fully cleaned at step 98. Optionally, the trench sidewall rough surfaces are slightly etched to make them smoother. At step 100, the reusable template is complete.

The 3-D TFSS manufacturing process of using the double-sided honeycomb template is substantially the same as the planar TFSS making process, except the reinforcement plates may not be needed prior to the TFSS releasing. For simplicity, the 3-D TFSS making process is not shown in figures.

Figure 7:
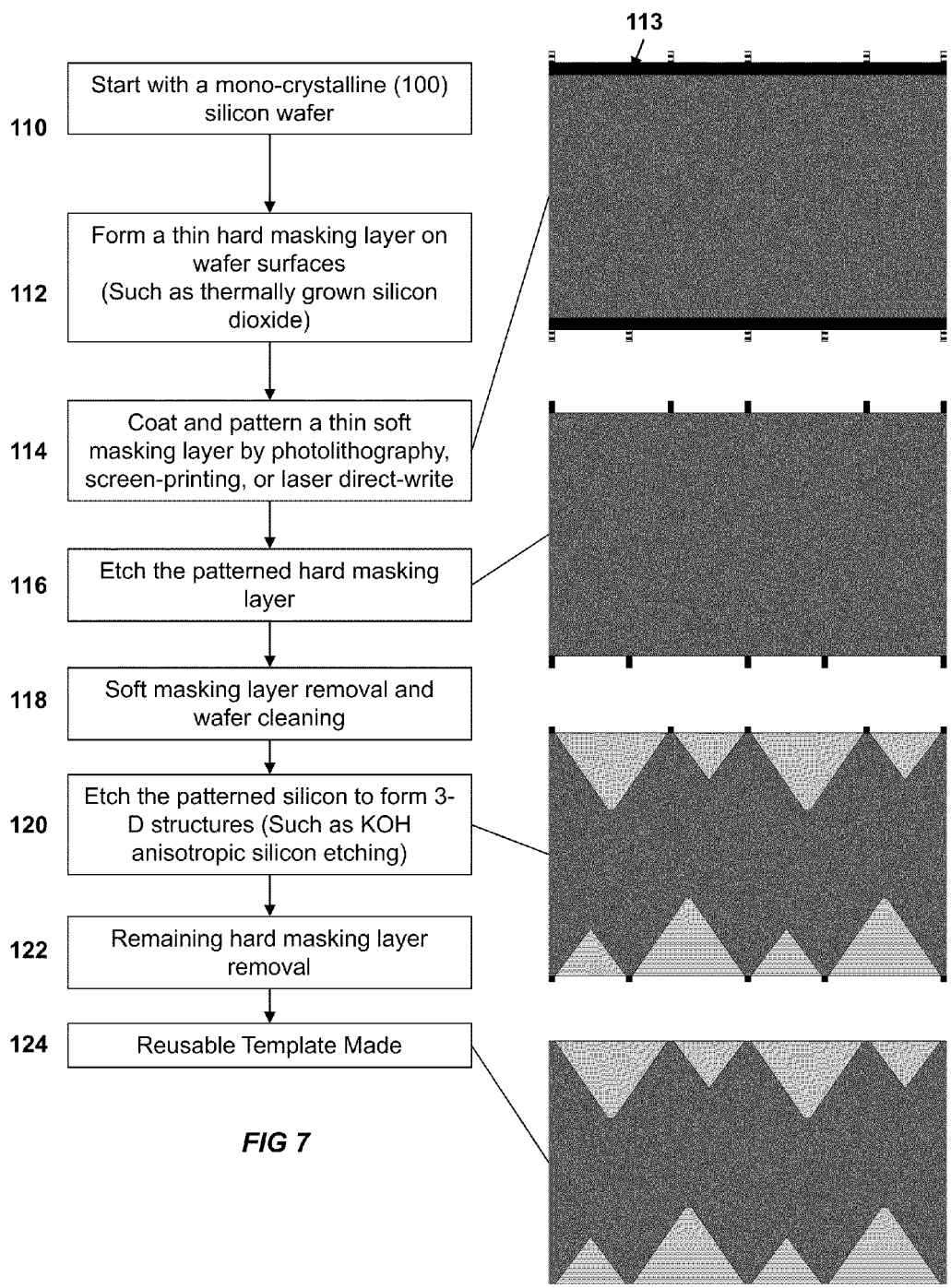
FIG. 7 illustrates major fabrication process steps for making double-sided re-usable templates that have inverted pyramidal cavities.

FIG. 7 illustrates major fabrication process steps for making double-sided re-usable templates that have inverted pyramidal cavities. Such 3-D templates are used to make pyramidal TFSSs. The template fabrication process starts at step 110 with a monocrystalline (100) silicon wafer. The thickness of the wafers is in the range of approximately 0.5 to 1 mm (or even a few mm). In step 112, a thermally grown oxide layer of about 0.5 to 1.5 microns is used as hard mask layer 113. The silicon oxide layer covers the entire wafer surfaces including the edges. The oxide on the wafer edge is not shown.

Next, at step 114, photolithographic defined or screen-printed photoresist pattern is applied on the front and back wafer surface. The photolithography process includes photoresist coating, baking, exposure, developing and post baking. The photoresist pattern consists of staggered large square openings and small square openings. It is important the square-opening patterns are precisely aligned to the wafer <100> direction on the front surface.

The patterned resist pattern is then transferred at step 116 to the hard masking layer, i.e. the front oxide layer. The pattern transferring from the photoresist layer to the oxide layer is achieved by controlled oxide etching in a buffered HF solution. During the HF wet etching, the front and back oxide opening are etched in the same time and the edge oxide layer is fully protected and kept at its original thickness. The oxide pattern on the wafer surfaces also consists of staggered large and small square openings that are aligned to the <100> crystallographic directions.

After the pattern transfer, at step 118, the remaining photoresist layer is removed by wet or dry photoresist removal methods. Next, at step 120, silicon anisotropic etching is conducted by a time-controlled KOH, NaOH, or TMAH etching that results in large pyramidal silicon cavities. The etching temperature may be in the range of approximately 50° C. to 80° C. The exposed silicon surfaces on the front and back sides are etched in the same time and the wafer edge surfaces are fully protected by the un-patterned oxide layer. The KOH etch may be time-controlled so that a certain pyramidal cavity depth may be reached. Alternatively, the KOH etching may be self-terminated when the four pyramid (111) sidewalls meet at the cavity bottom.

After the KOH etching, the remaining oxide layer is thinner than before the etching since the oxide is also etched to some extent in the KOH or TMAH solution, albeit with a much slower etch rate than silicon etch. The remaining oxide layer is then removed at step 122 in a diluted HF solution followed by standard wafer cleaning in SC2 and SC2, DI water rinsing and $N_2$ drying. At step 124, reusable pyramidal double-sided template is finished.

The 3-D TFSS manufacturing process of using the double-sided pyramidal template is same as the planar TFSS making process, except the reinforcement plates may not be needed prior to the TFSS releasing. For simplicity, the 3-D TFSS making process is not shown in figures.

Figure 8:
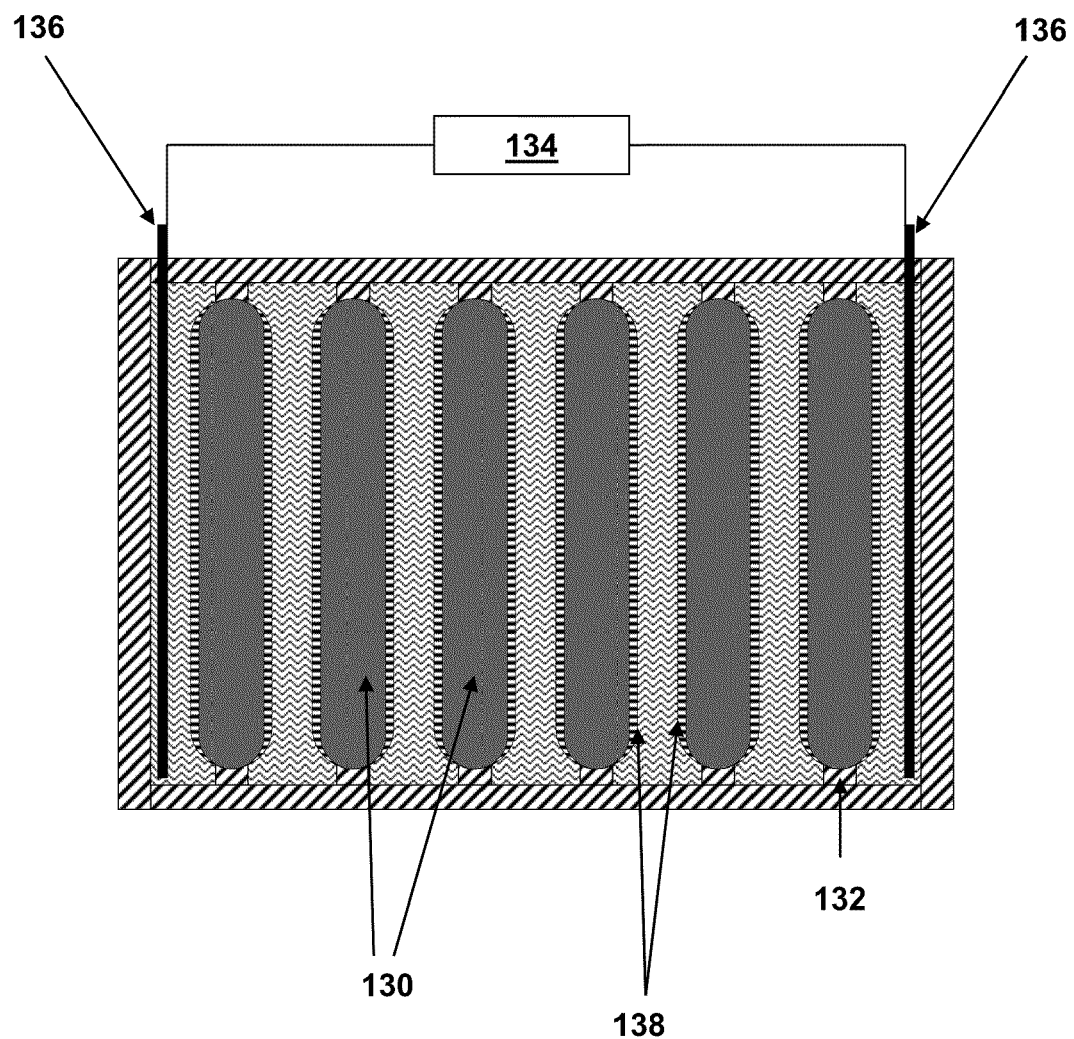
FIG. 8 illustrates a conceptual cross-sectional drawing of an apparatus for forming porous silicon layers on both sides of a silicon template in a batch process.

FIG. 8 illustrates a conceptual cross-sectional drawing of one possible embodiment of an apparatus for forming porous silicon layers on both sides of the silicon template in a batch electrochemical anodic etch process. Templates 130 are batch loaded in the etching chamber and they are individually held from and sealed at their edges with seals 132. Therefore there are no porous silicon layers formed at the very edge surface of the template. The loaded templates are spaced uniformly in the etching chamber and the electrolytic liquid (HF, IPA, and DI water mixture) between the templates has a consistent concentration and volume. The temperature of the liquid is actively controlled and gas bubbles generated during the process are timely removed by external liquid circulation and gas bubble extraction. Power supply 134 supplies power with current intensity control, time control, and polarity switching capability to electrodes 136. The electrical current polarity is periodically switched so that each template side is consecutively and cumulatively etched. In addition to the periodical current polarity switching, the current intensity is also changed in a controlled manner to form a porous silicon layer that may consists of two or thin layers with different porosities, or a graded porosity. One of ordinary skill will understand that different electrolyte volumes and concentrations, etch chamber sizes, distances between adjacent templates, current levels and polarities may be used in the embodiment of FIG. 8. The passage of electrical current creates porous silicon layers 138.

Figure 9:
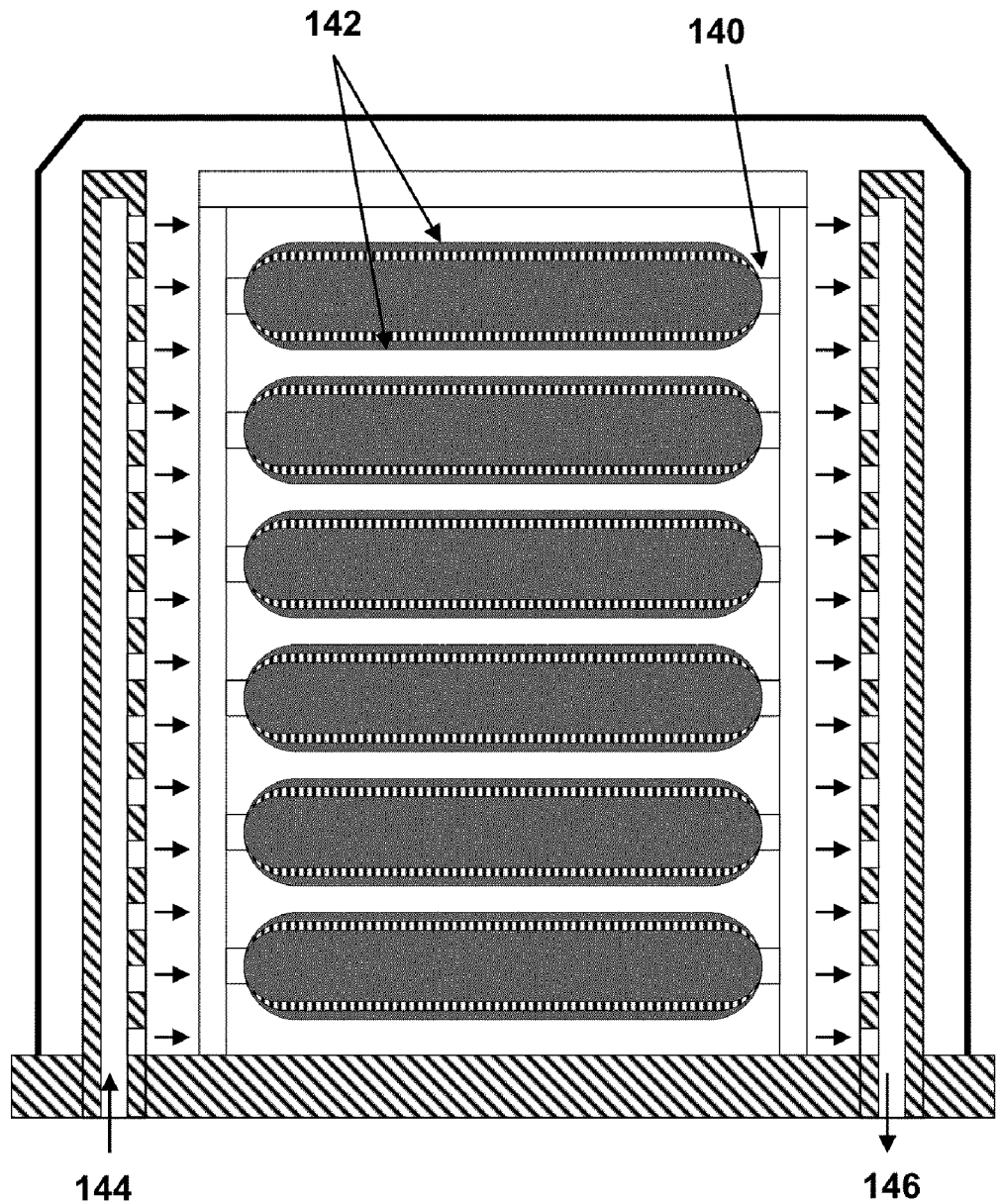
FIG. 9 illustrates a conceptual cross-sectional drawing of an apparatus for growing epitaxial silicon layers on both sides of a silicon template in a batch process.

FIG. 9 illustrates a conceptual cross-sectional drawing of an apparatus for concurrently growing epitaxial silicon layers on both sides of the silicon template in a batch process. As described above, porous silicon layers are formed on both sides of the silicon templates, except the very edges of the templates. The templates are batch loaded in the epitaxial reaction chamber and they are individually held from their edges where there are no porous silicon layers.

This edge-holding method prevents broken porous silicon debris from accumulating during the template loading and unloading process. The loaded templates are spaced uniformly in the reaction chamber. With the distributed gas injection layout, reactive gases are evenly delivered from gas injector 144 to all the exposed silicon surfaces and exhausted via exhaust 146, enabling uniform epitaxial growth within a single wafer and among wafers. The reaction chamber is heated to a high temperature in the range of 950° C. to 1200° C. during the process. The heating and its control function are not shown in FIG. 9 for simplicity.

Those with ordinary skill in the art will recognize that the disclosed embodiments have relevance to a wide variety of areas in addition to those specific examples described above.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A method for making a pair of monocrystalline thin-film silicon substrates, said method comprising:

providing a monocrystalline silicon wafer;
patterning a first surface and a second surface of said monocrystalline silicon wafer with a resist layer having a hexagonal pattern;
etching said monocrystalline silicon wafer, thereby producing a set of structural surface topography features on said first surface and said second surface, said structural surface topography features comprising a plurality of isolated hexagonal posts;
removing said resist layer from said monocrystalline silicon wafer; and
cleaning said first surface and said second surface of said monocrystalline silicon wafer, said monocrystalline silicon wafer comprising a double-sided reusable template;
producing a first porous silicon layer on said first surface and a second porous silicon layer on said second surface of said double-sided reusable template via an anodic etching process, said porous silicon layers having a crystallinity consistent with said double-sided reusable template;
epitaxially depositing a first monocrystalline thin-film silicon substrate on said first porous silicon layer and a second monocrystalline thin-film silicon substrate on said second porous silicon layer, said monocrystalline thin-film silicon substrates having a crystallinity consistent with said porous silicon layers;
separating said first and said second monocrystalline thin-film silicon substrates from said first and said second porous silicon layers.

2. The method of claim 1, wherein said first porous silicon layer comprises a first porous silicon bilayer having at least two different porosities, and said second porous silicon layer comprises a second porous silicon bilayer having at least two different porosities.

3. The method of claim 1, wherein said first porous silicon layer comprises a first graded porosity layer, and said second porous silicon layer comprises a second graded porosity layer.

4. The method of claim 1, wherein said monocrystalline thin-film silicon substrates comprise in-situ doped monocrystalline thin-film silicon substrates.

5. The method of claim 4, wherein each of said in-situ doped monocrystalline thin-film silicon substrates comprises a front-surface field layer and a base layer for a photovoltaic solar cell.

6. The method of claim 4, wherein each of said in-situ doped monocrystalline thin-film silicon substrates comprises a front-surface field layer, a base layer, and an emitter layer for a photovoltaic solar cell.

7. The method of claim 1, further comprising the step of heating said double-sided reusable template in an atmosphere of hydrogen after producing said first and said second porous silicon layers in situ and prior to said epitaxial depositing step.

8. A method for making a pair of monocrystalline thin-film silicon substrates, said method comprising:
providing a monocrystalline silicon wafer;
producing a thermally grown silicon oxide layer on a first surface and a second surface of said monocrystalline silicon wafer;
patterning said first surface and said second surface of said monocrystalline silicon wafer with a resist layer comprising large squares and small squares, said large and small squares being aligned to a <110> direction of said monocrystalline silicon wafer;
transferring said pattern of large squares and small squares to said silicon oxide layer;
anisotropically etching said monocrystalline silicon wafer, thereby producing a set of structural surface topography features on said first surface and said second surface, said structural surface topography features comprising a plurality of square pyramidal cavities;
removing said resist layer from said monocrystalline silicon wafer; and
cleaning said first surface and said second surface of said monocrystalline silicon wafer, said monocrystalline silicon wafer comprising a double-sided reusable template;
producing a first porous silicon layer on said first surface and a second porous silicon layer on said second surface of said double-sided reusable template via an anodic etching process, said porous silicon layers having a crystallinity consistent with said double-sided reusable template;
epitaxially depositing a first monocrystalline thin-film silicon substrate on said first porous silicon layer and a second monocrystalline thin-film silicon substrate on said second porous silicon layer, said monocrystalline thin-film silicon substrates having a crystallinity consistent with said porous silicon layers;
separating said first and said second monocrystalline thin-film silicon substrates from said first and said second porous silicon layers.

9. The method of claim 8, wherein said first porous silicon layer comprises a first porous silicon bilayer having at least two different porosities, and said second porous silicon layer comprises a second porous silicon bilayer having at least two different porosities.

10. The method of claim 8, wherein said first porous silicon layer comprises a first graded porosity layer, and said second porous silicon layer comprises a second graded porosity layer.

11. The method of claim 8, wherein said monocrystalline thin-film silicon substrates comprise in-situ doped monocrystalline thin-film silicon substrates.

12. The method of claim 11, wherein each of said in-situ doped monocrystalline thin-film silicon substrates comprises a front-surface field layer, a base layer, and an emitter layer.

13. The method of claim 8, further comprising the step of heating said double-sided reusable template in an atmosphere of hydrogen after producing said first and said second porous silicon layers.

* * * * *